United States Patent [19]

Yamazaki et al.

[11] Patent Number: 5,092,729
[45] Date of Patent: Mar. 3, 1992

[54] APPARATUS FOR TRANSPORTING A WAFER AND A CARRIER USED FOR THE SAME

[75] Inventors: Takashi Yamazaki; Toshinori Kobayashi, both of Katsuta, Japan

[73] Assignee: Hitachi, Ltd., Tokyo, Japan

[21] Appl. No.: 602,679

[22] Filed: Oct. 24, 1990

[30] Foreign Application Priority Data

Oct. 27, 1989 [JP] Japan .................................. 1-278400

[51] Int. Cl.⁵ ...................... H01L 21/30; H01J 37/20
[52] U.S. Cl. .................................. 414/225; 414/217; 118/505; 204/298.15; 204/298.25
[58] Field of Search ...................... 414/225, 217, 331; 204/298.15, 298.25; 118/504, 505

[56] References Cited

U.S. PATENT DOCUMENTS

| 3,874,525 | 4/1975 | Massan et al. | 414/225 |
| 4,278,380 | 7/1981 | Guarino | 414/217 |
| 4,676,193 | 6/1987 | Martin | 118/505 X |
| 4,705,950 | 11/1987 | Ohtaka | 414/217 X |
| 4,776,745 | 10/1988 | Foley | 414/217 |
| 4,897,171 | 1/1990 | Ohmi | 414/222 X |

FOREIGN PATENT DOCUMENTS 57-44543 8/1982 Japan .
59-29435 2/1984 Japan .
62-172149 10/1987 Japan .

Primary Examiner—Frank E. Werner
Assistant Examiner—James Ellen
Attorney, Agent, or Firm—Antonelli, Terry Stout & Kraus

[57] ABSTRACT

A wafer transporting apparatus comprising at least one carrier for supporting a substantially circular thin wafer having a flat plane, the carrier including a supporting base for supporting the wafer thereon, and a electrostatic chuck provided in the supporting base and having a contacting surface which face-wise contacts the flat plane of the wafer supported on the supporting base. The electrostatic chuck attracts the wafer so that the flat plane of the wafer contacts the contacting surface of the electrostatic chuck when the electrostatic chuck is energized. A holder holds the wafer at a position which has a predetermined positional relationship with respect to the supporting base. The carrier is selectively transported between a plurality of stations including a work station, fixing device for fixing the carrier transported to the work station at a predetermined position in the work station, and an arrangement for energizing the electrostatic chuck when the carrier is fixed at the predetermined position in the work station and deenergizing the electrostatic chuck when the carrier is apart from the predetermined position.

9 Claims, 6 Drawing Sheets

APPARATUS FOR TRANSPORTING A WAFER AND A CARRIER USED FOR THE SAME

BACKGROUND OF THE INVENTION

1. Field of the Invention

The present invention relates to a wafer transporting apparatus, and, more particularly, to a wafer transporting apparatus for use in an electron beam measuring apparatus, an electron beam lithography apparatus, an electron beam surface observing apparatus or the like used for semiconductor production or inspection and a wafer supporting carrier which is used for such a wafer transporting apparatus.

2. Description of the Related Art

The conventional wafer transporting apparatus may generally be classified into three following types.

In a first type, a wafer is pressed against fixed pins by a movable pin to fix the wafer on a wafer holding carrier device and a contact member for grounding the wafer extends from the wafer surface to break through a resist film, an oxide film or the like on the wafer so that the contact member is electrically connected to the wafer.

In a second type, a wafer is held on a carrier and its outer peripheral portion is gripped by suitable members disposed at a bottom side of the wafer and urged by a spring force, and a needle urged by a flat spring is provided in a pressure plate disposed at the top side of the wafer to be used as a grounding contact for grounding the wafer, as shown in Japanese Utility Model un-examined publications JP-A-62-172149 (U) or JP-A-57-44543 (U).

In a third type, a wafer is held on a carrier by virtue of an electrostatic attracting force based on an electric power supplied even during the transport of the wafer from an atmospheric environment to an X-Y stage which is placed in a vacuum environment and where further processing such as measurement, lithographic processing or inspection of the wafer is conducted.

In the first type of conventional apparatus, it is difficult to maintain the flatness over the surface of the wafer since only the outer peripheral portion of the wafer is fixed. Therefore, there is a problem in that a large dimensional error is locally produced upon measurement or lithographing due to a change of the degree of flatness of the wafer. Also, there is a problem in that the wafer grounding contact member causes the deposition of undesired substances on the wafer surface.

Also in the second type of conventional apparatus, it is difficult to maintain the flatness of the wafer. Like the first type of conventional apparatus, the second type of conventional apparatus has a problem in that a large dimensional error is locally produced upon measurement or lithographing due to a change of the degree of flatness of the wafer.

In the third type of conventional apparatus in which the wafer is fixed by virtue of the electrostatic attracting force, a supply of a DC electric power is required even during the transport of the wafer from the atmospheric environment to the X-Y stage in the vacuum environment. Therefore, it is difficult to simplify a transporting mechanism or a complicated transporting mechanism having parts for insulation and power supply incorporated therein is required.

SUMMARY OF THE INVENTION

An object of the present invention is to provide a wafer transporting apparatus which is capable of simplifying a wafer transporting mechanism.

Another object of the preset invention is to provide a wafer transporting apparatus which is capable of ensuring a predetermined work precision over the entire surface of a wafer.

A further object of the present invention is to provide a wafer transporting apparatus which is capable of preventing undesired substances from depositing on the surface of a wafer.

A still further object of the present invention is to provide a wafer supporting carrier which is suitable for use in the above wafer transporting apparatus.

According to the present invention, an apparatus for transporting a wafer comprises at least one carrier for supporting a substantially circular thin wafer having a flat plane, with the carrier including a supporting base for supporting the wafer thereon, and electrostatic attracting means or electrostatic chuck provided in the supporting base and having a contacting surface which face-wise contacts the flat plane of the wafer supported on the supporting base. The electrostatic chuck attracts the wafer so that the flat plane of the wafer contacts the contacting surface of the electrostatic chuck when the electrostatic chuck is energized. Means are provided for holding the wafer at a position which has a predetermined positional relationship with respect to the supporting base, and means selectively transport the carrier between a plurality of stations which includes a work station. Fixing means fix the carrier transported to the work station at a predetermined position in the work station, and means are provided for normally deenergizing the electrostatic chuck and energizing the chuck when the carrier is fixed at the predetermined position in the work station.

Preferably, the wafer transporting apparatus further comprises means for deenergizing the electrostatic chuck when the carrier is spaced from the predetermined position in the work station. The wafer holding means includes a plurality of fixed contact members for contacting an outer periphery surface of the wafer when the wafer is placed at the predetermined position, with at least one movable contact member being capable of selectively moving between a first position where the movable contact member engages with the outer periphery surface of the wafer so that the wafer is held at the predetermined position with the outer periphery surface of the wafer contacting the fixed contact members and a second position where the movable contact member is released from the engagement thereof with the outer periphery surface of the wafer so that the wafer can be taken out of the predetermined position.

According to further features of the present invention, a carrier for supporting a substantially circular thin wafer having a flat plane comprises a supporting base for supporting the wafer, with electrostatic attracting means or electrostatic chuck being provided in the supporting base and having a contacting surface which face-wise contacts the flat plane of the wafer supported on the supporting base. The electrostatic chuck attracts the wafer so that the flat plane of the wafer contacts the contacting surface of the electrostatic chuck when the electrostatic chuck is energized. Means are provided for receiving an external electrical energy to energize the electrostatic chuck, with a plurality of fixed contact members holding the wafer at a position which has a predetermined positional relationship with respect to the supporting base. The plurality of fixed contact members engage with an outer periphery surface of the wafer to define a position of the outer periphery surface, with at least one movable contact member being capable of selectively moving between a first position where the movable contact member engages with the outer periphery surface of the wafer and a second position where the movable contact member is released from the engagement thereof with the outer periphery surface of the wafer. Driving means are provided for selectively moving the movable contact member between the first position and the second position.

BRIEF DESCRIPTION OF THE DRAWINGS

FIG. 11 is a view showing the detailed structure of a carrier transporting rod.

DESCRIPTION OF THE PREFERRED EMBODIMENTS

Figure 1:
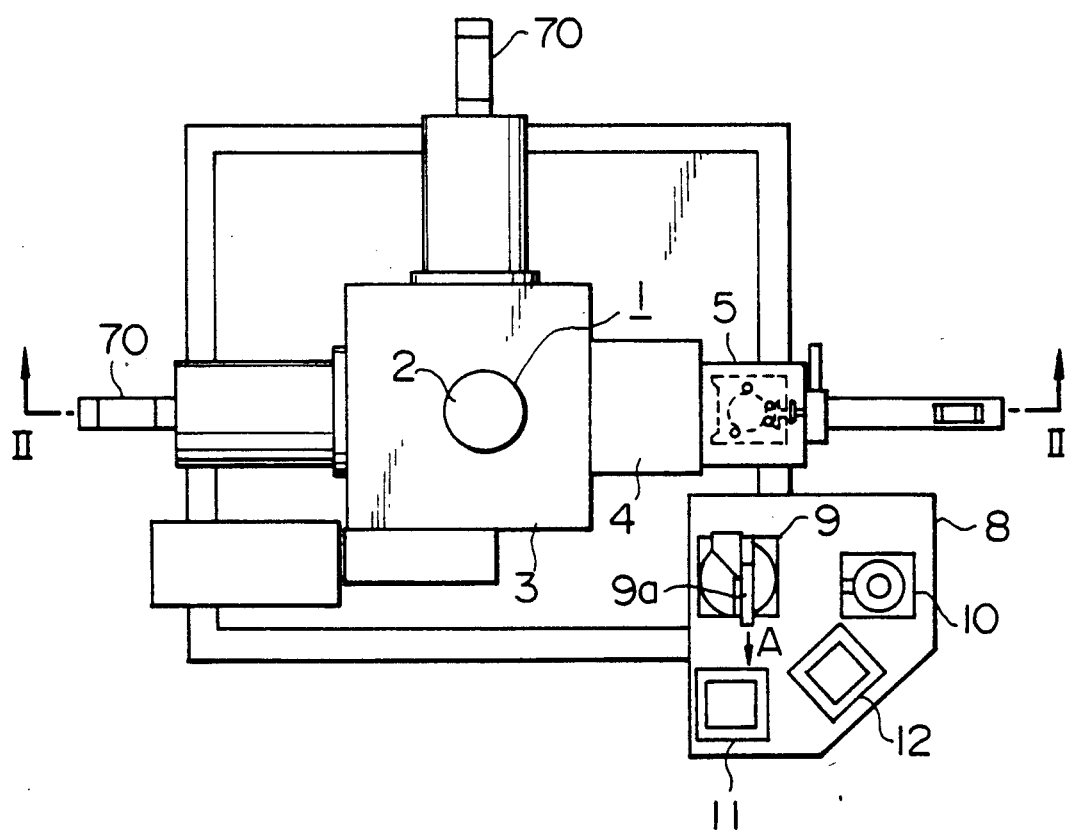
FIG. 1 is a plan view of an electron beam lithography apparatus to which a wafer transporting apparatus according to the present invention is applied.
Figure 2:
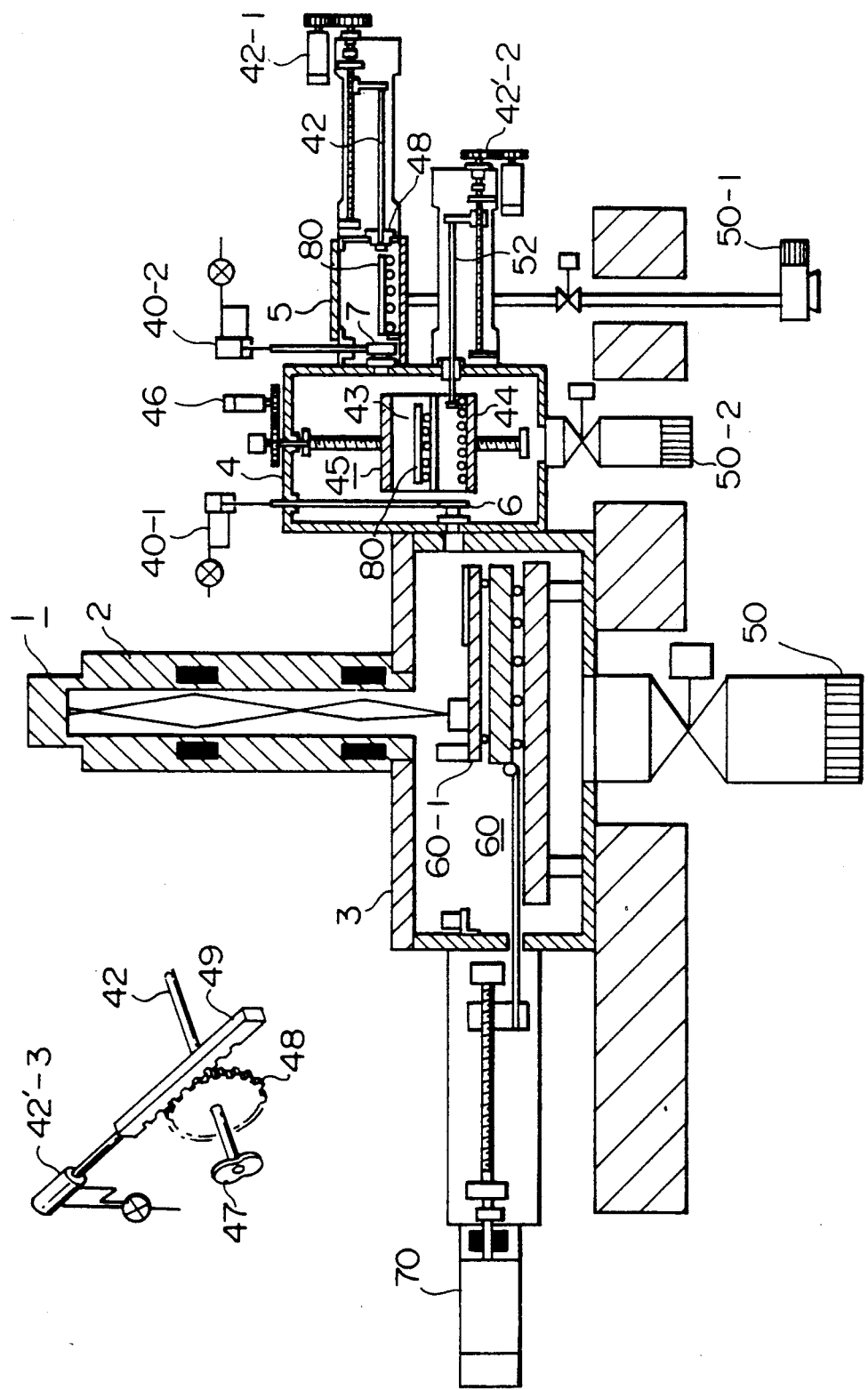
FIG. 2 is a cross sectional view taken along line II—II in FIG. 1.

An embodiment of the present invention will now be explained in reference with FIGS. 1 and 2 in conjunction with the case where a wafer transporting apparatus according to the present invention is applied to an electron beam lithography apparatus.

A body 1 of the electron beam lithography apparatus comprises a column 2 and a sample chamber 3. an electron beam is emitted from an electron gun in the column 2 and is focused by a lens system. A wafer, which is a sample in the sample chamber, is irradiated with the focused electron beam.

Any desired pattern can be formed on the wafer by moving the wafer two-dimensionally in a vertical plane of the electron beam and turning on/off the irradiation of the wafer with the electron beam or changing the size of a rectangular cross section of the electron beam with which the wafer is irradiated. Namely, a process called lithographying can be conducted.

The process conducted for the wafer is not limited to the lithographying and, such process may, for example, include a inspection or observation of the wafer surface, etching of the wafer surface, and so on.

The body 1 is maintained in a high vacuum condition. The body 1 communicates with the sample chamber 3 where a work station for performing a predetermined process upon the wafer is provided. The degree of vacuum of the sample chamber 3 is about $10^{-6}$ Torr. A high vacuum chamber 4, maintained in a high vacuum condition, and a low vacuum chamber 5 are successively connected to the sample chamber 3 through valves 6 and 7, respectively. The degree of vacuum of the high vacuum chamber 4 is on the order of $10^{-6}$ Torr which is the same as the sample chamber 3 and the degree of vacuum of the low vacuum chamber 5 is on the order of $10^{-2}$ Torr. Each of the high vacuum chamber 4 and the low vacuum chamber 5 is provided with an intermediate station for temporarily holding the wafer when the wafer is to be transported into the sample chamber or is taken out of the sample chamber.

A stand 8 existing in the atmospheric pressure is furnished with a robot 9 and a pre-aligner 10. Further, two wafer cassettes 11 and 12 are placed on the stand 8. The robot 9 is rotatable at a shown position with an arm 9a of the robot 9 being extensible in a direction indicated by arrow A so that the robot 9 can take a wafer out of any one of the wafer cassettes 11 and 12, the pre-aligner 10 and the low vacuum chamber 5 or set a wafer therein. A valve (not shown) is provided at a portion of the low vacuum chamber 5 into and out of which the robot arm 9a extends. This valve is hereinafter referred to as a robot side valve.

Three wafer carriers or wafer units 80 are provided for transport of a wafer 13a between the sample chamber 3 and the low vacuum chamber 5 through the high vacuum chamber 4. As shown in FIGS. 3 to 8, the carrier 80 includes an electrostatic chuck 14 for electrostatically attracting the wafer 13a and a supporting base 15 for supporting the wafer 13a. The carrier 80 is provided with fixed pins 16 and a movable pin 17. The pins 16 and 17 are contact members which engage the outer periphery of the wafer 13a to position the wafer. The pins 16 and 17 are freely rotatable. Pins 16 are fixed on an upper surface of the supporting base 15. In order that a movable pin 17 can freely move, the movable pin 17 passes through an elongated slot formed in the supporting base 15 and is connected to a lever 18 which is swingable around a pin fixed to the bottom side of the supporting base 15. A spring 19 is provided between the arm or lever 18 and the supporting base 15 to normally urge the movable pin 17 against the outer periphery of the wafer 13a.

Figure 6:
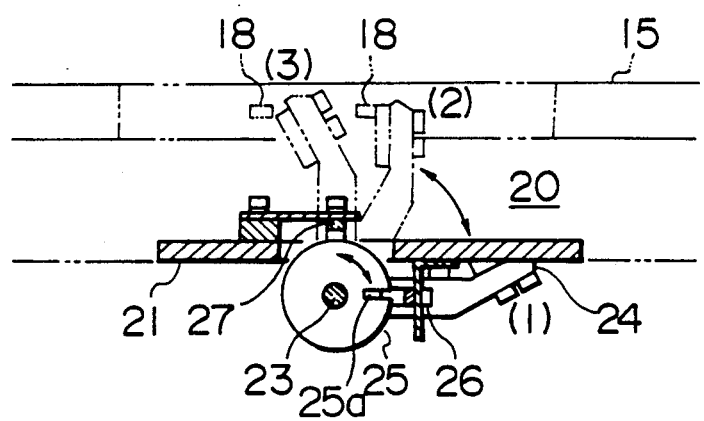
FIG. 6 is a cross sectional view taken along line VI—VI in FIG. 3

If the lever 18 is moved against a force of the spring 19, the movable pin 17 is disengaged from the outer periphery of the wafer 13a so that the wafer 13a is released from the fixed condition. This release of the wafer is effected by a lever driver 20. FIG. 6 illustrates the structure of the lever driver 20 in detail. A mount 21 is fixed to the low vacuum chamber 5 and a motor 22 (FIG. 3) is installed on the mount 21. A driving shaft 23 is connected to the motor 22. A lever driving arm 24 and a sensor slit plate 25, having a slit 25a formed therein as shown in FIG. 6, are coupled to the driving shaft 23. The mount 21 is provide photosensors 26 and 27 for detecting the slit of the sensor slit plate 25. The photosensor 26 is positioned as shown. Therefore, when the lever driving arm 24 is brought into a position (1), the photosensor 26 is activated to stop the lever driving arm 24 at the position (1). When the driving shaft 23 or the sensor slit plate 25 is rotated by 90° with the lever driving arm 24 reaching a position (3) through a position (2), the photosensor 27 is activated to stop the lever driving arm 24 at the position (3). When the lever driving arm 24 is placed at the position (1), the movable pin 17 engages the outer periphery of the wafer 13a to fix the wafer 13a at a predetermined position on the supporting base 15 in cooperation with the fixed pins 16. When the lever driving arm 24 is placed at the position (3), the lever 18 is pushed by the lever driving arm 24 so that the movable pin 17 is disengaged from the outer periphery of the wafer so as to allow the wafer 13a to be removed from the carrier 80.

Figure 5:
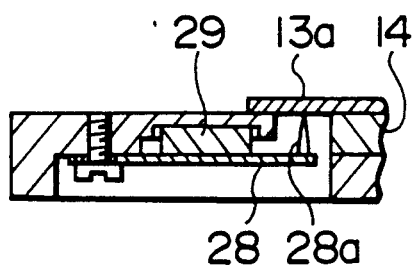
FIG. 5 is a cross sectional view taken along line V—V in FIG. 3.

As shown in FIG. 5, a contact holding flat spring 28 having at one end thereof a needle-like conductive contact 28a is threadably secured at the other end thereof to the lower surface of the supporting base 15. A piezoelectric element 29 is provided between the flat spring 28 and the lower surface of the supporting base 15. When a voltage is applied to the piezoelectric element 29 from a power source 30 for piezoelectric element (FIG. 9), the piezoelectric element 29 shrinks so that the contact 28a connected to the one end of the flat spring 28 moves upward through a hole provided in the supporting base 15 and contacts the lower surface of the wafer 13a beyond the upper surface level of the electrostatic chuck 14. Thereby, the wafer 13a is connected through the contact 28a to a predetermined potential which may be a ground level.

Four contacts 31, isolated from each other, are fixed at an end portion of the supporting base 15. Two of the four contacts 31 are connected to the piezoelectric element 29 and the remaining contacts are connected to the electrostatic chuck 14.

When a voltage is applied to the electrostatic chuck 14 through the contacts 31 from a power source 32 for electrostatic attraction (FIG. 9), the wafer 13a is electrostatically attracted or held on the upper surface of the electrostatic chuck 14. An electrostatic chuck, of the aforementioned type is disclosed in, for example, Japanese Patent un-examined publication JP-A-59-29435 may be used.

Figure 9:
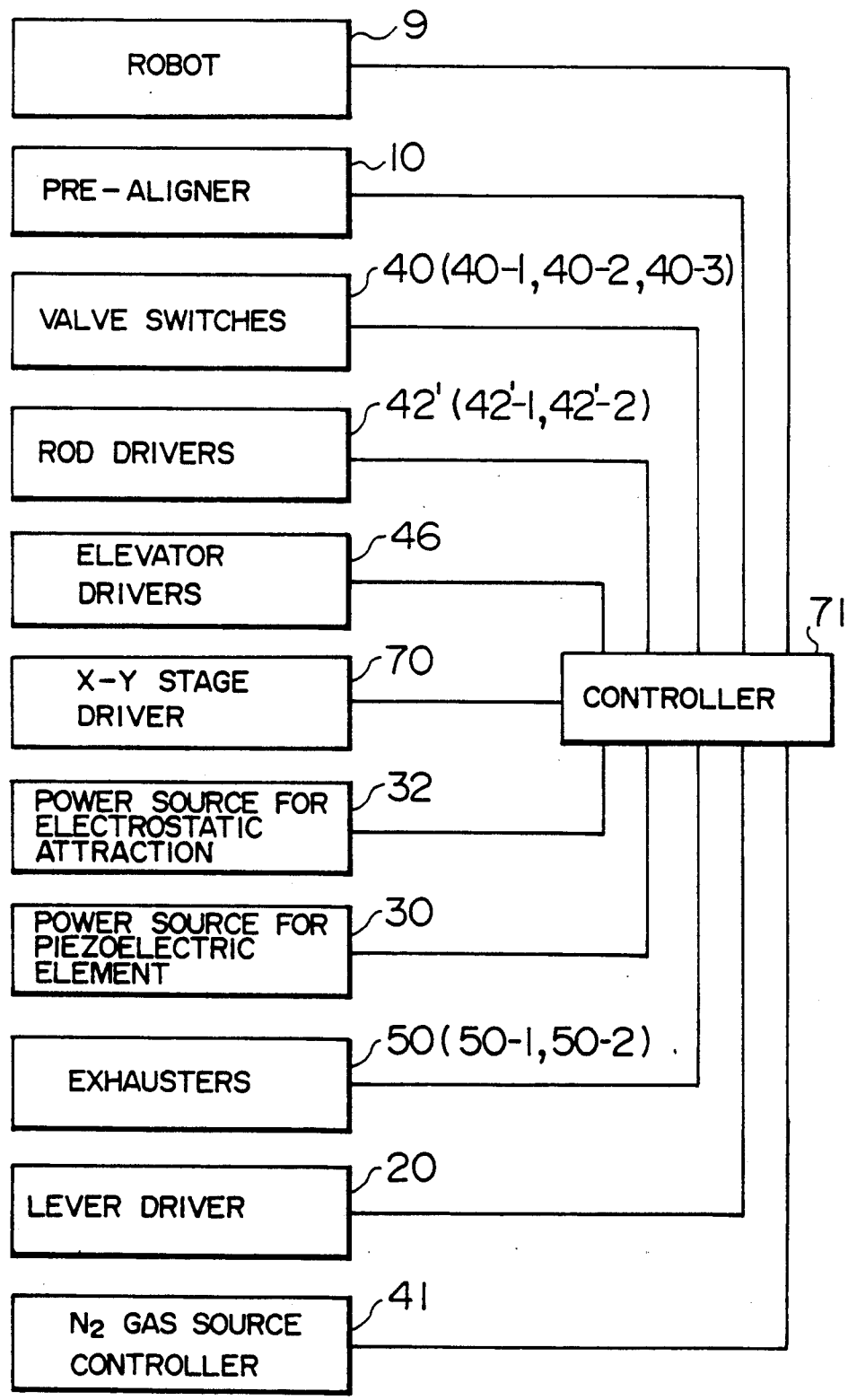
FIG. 9 is a block diagram showing the construction of a control system.

In operation, after the valve 7 has been closed by a valve driver 40-2, an $N_2$ gas is introduced into the low vacuum chamber 5 from an $N_2$ gas source (not shown) by an $N_2$ gas source controller 41 (FIG. 9) so that the pressure in the low vacuum chamber 5 becomes equal to the atmospheric pressure, and the robot side valve is opened by a valve driver 40-3 (FIG. 9). In this state, the wafer 13a is released from its fixed condition by the lever driver 20. Namely, the movable pin 17 is disengaged from the outer periphery of the wafer 13a (step 101 in FIG. 10). The robot 9 holds the wafer 13a by virtue of the robot arm 9a and transfers the wafer from the supporting base 15 to the cassette 11 through the robot side valve (step 102 in FIG. 10). The wafer 13a is a processed wafer, that is, a wafer which was taken out of a certain location in the cassette 11 by the robot 9 and to which a predetermined work was conducted. When the robot 9 puts the wafer 13a into the cassette 11, the wafer 13a is placed into the location of the cassette 11 out of which the wafer was previously taken. It is preferable that a model TL-80 manufactured by Mex Co., Ltd. is used as the robot 9.

Figure 3:
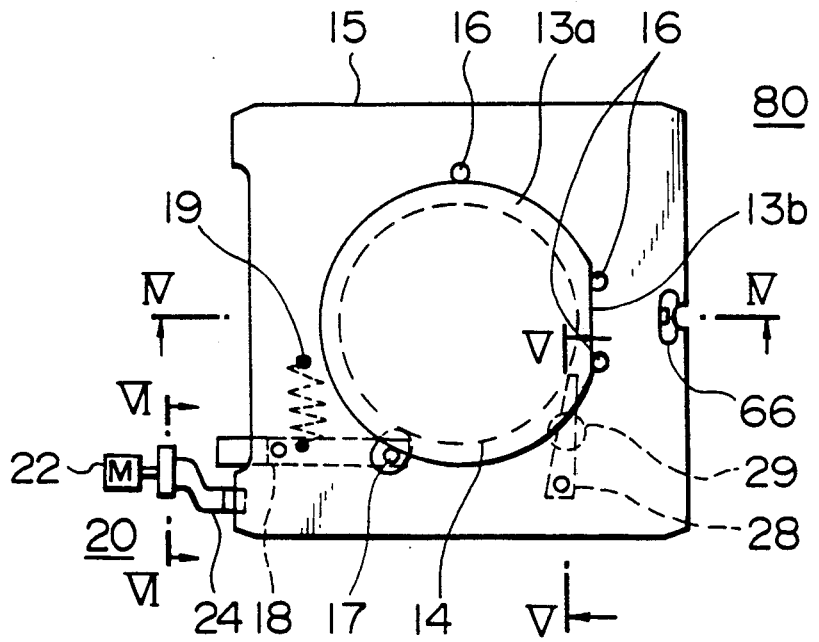
FIG. 3 is a plan view of a carrier.
Figure 4:
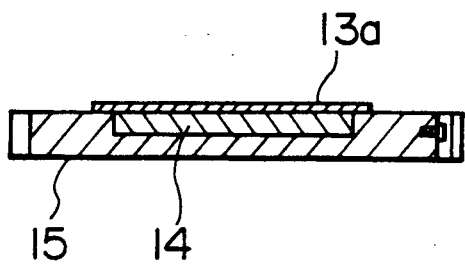
FIG. 4 is a cross sectional view taken along line IV—IV in FIG. 3.

The robot 9 takes a new wafer out of another location in the cassette 11 by virtue of the robot arm 9a and transfers it to the pre-aligner 10. In the prealigner 10, the new wafer 13a is pre-aligned so that a flat orientation portion 13b of the wafer is oriented in a predetermined direction (step 103 in FIG. 10). It is preferable that a model OF-100 manufactured by Mex Co., Ltd. is used as the pre-aligner 10. The new and prealigned wafer is translated onto the surface of the electrostatic chuck 14 of the supporting base 15 by the robot 9 and is fixed thereon. Namely, the lever driver 20 operable to allow the movable pin 17 to engage with the outer periphery of the wafer by a force of the spring 19 to thereby fix the wafer so that the wafer is grasped by the movable pin 17 and the fixed pins 16 (step 104 in FIG. 10). At this time, since the wafer has been oriented in the predetermined direction by the pre-aligner, the flat orientation portion 13b of the wafer 13a engages with the two fixed pins 16, as shown in FIG. 3, so that the wafer is accurately fixed in a predetermined positional relationship with respect to the supporting base 15. The arm 9a of the robot 9 is moved back from the low vacuum chamber 5 and the robot side valve is thereafter closed. The introduction of the $N_2$ gas into the low vacuum chamber 5 is stopped and the low vacuum chamber 5 is exhausted to the degree of vacuum on the order of $10^{-2}$ Torr by an exhauster 50-1.

The valve 7 is opened by the valve driver 40-2 and a first carrier 80 having the new wafer supported by the supporting base 15 is transferred from a station in the low vacuum chamber 5 into a station in the high vacuum chamber 4 by a rod 42 driven by a rod driver 42'-1 (see FIG. 9). The station in the high vacuum chamber 4 includes an elevator 45 which has an upper stage of wafer receiving portion 43 and a lower stage of wafer receiving portion 44. The ascent and descent of the elevator 45 are effected by an elevator driver 46.

Figure 10:
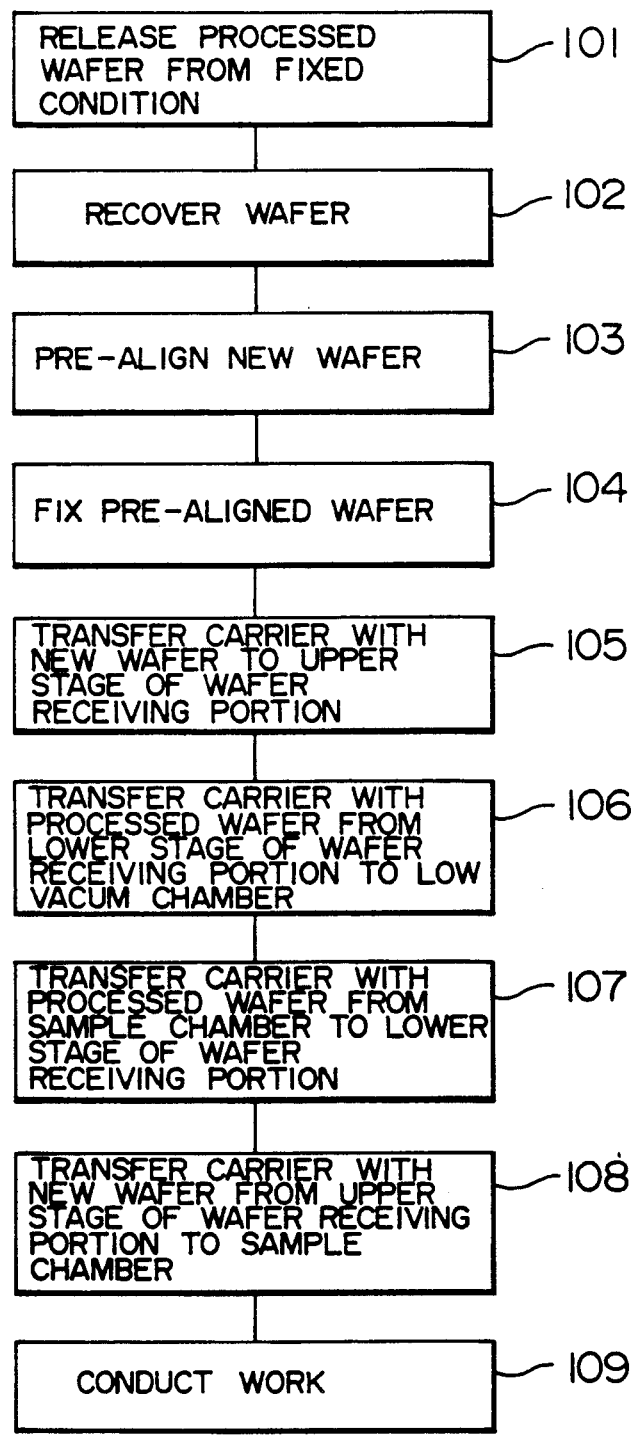
FIG. 10 is a flow chart showing an operation of the control system.

The first carrier 80 is trans low vacuum chamber 5 to the upper stage of wafer receiving portion 43 of the elevator 45 (step 105 in FIG. 10). In the case where a second carrier 80 supporting thereon the processed wafer is present on the lower stage of wafer receiving portion 44, the second carrier 80 is transferred to the station of the low vacuum chamber 5 by the rod 42 (step 106 in FIG. 10). In step 105 the upper stage of wafer receiving portion 43 is moved to the same level as that of the valve 7 and, in step 106, the lower stage of wafer receiving portion 44 is moved to the level of the valve 7.

The valve 7 is closed. Since the high vacuum chamber 4 is continuously exhausted by an exhauster 50-2, the high vacuum chamber 4 is brought into a steady state on the order of $10^{-6}$ Torr. In this state, the valve 6 is opened by a valve driver 40-1. In the case where a third carrier 80 supporting thereon a processed wafer having been subjected to a lithographic process at a work position or a lithographying position in the sample chamber 3 is present on the work station, the third carrier 80 is transferred to the lower stage of wafer receiving portion 44 in the high vacuum chamber 4 by a rod 52 driven by a rod driver 42'-2 (step 107). And, the first carrier 80 existing on the upper stage of wafer receiving portion 43 is transferred onto a two-dimensionally movable X-Y stage 60-1 provided at the work station of the sample chamber 3 by means the rod 52 (step 108), the X-Y stage is movable and Y-directions by control of an X-Y stage driver 70. In step 107, the lower stage of wafer receiving portion 44 is moved to the level of the valve 6n and in step 108 the upper stage of wafer receiving portion 43 is moved to the level of the valve 6.

Figure 7:
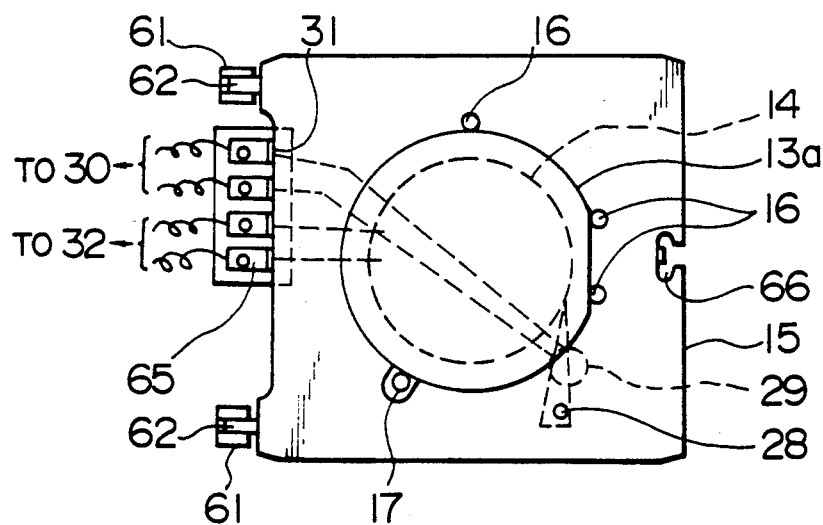
FIG. 7 is a schematic view showing, in conjunction with a work station, means for fixing a carrier at a predetermined position and means for supplying an electrical energy to an electrostatic chuck.
Figure 8:
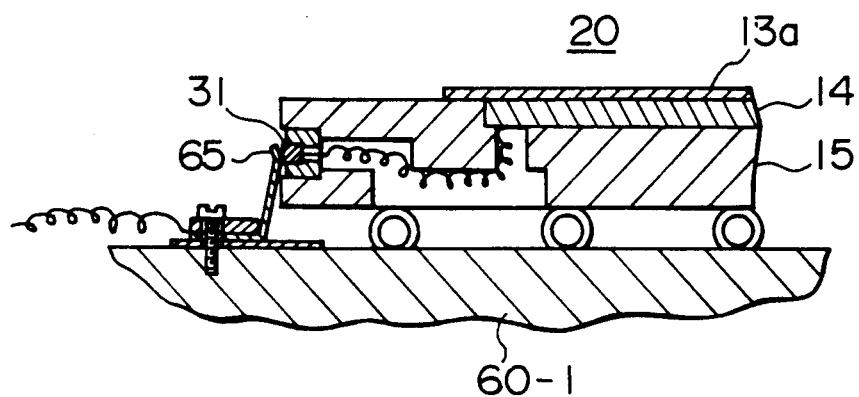
FIG. 8 is a partially enlarged cross sectional view of FIG. 7.

The first carrier 80 transferred to the X-Y stage 60-1 of the work station 60 in the sample chamber 3 is further transferred to the work position or the lithographing position by the rod 52. This state is shown in FIGS. 7 and 8. Pins 62, provided at the supporting base 15, are fitted in pin fixing blocks 61, respectively, fixed to the X-Y stage 60-1 so that the first carrier 80 is set to the work position which has a predetermined positional relationship with respect to the X-Y stage 60-1. In this state, the four contacts 31 respectively contact with contact spring plates 65 fixed to the X-Y stage 60-1 so that voltages are supplied from the power sources 32 for electrostatic attraction and the power source 30 for piezoelectric element to the electrostatic chuck 14 and the piezoelectric element 29, respectively. Thereby, the wafer on the first carrier 80 is electrostatically attracted on the electrostatic chuck. In this state, the wafer is maintained at a predetermined potential.

The contact spring plates 65 are connect the power source 32 for electrostatic attraction and the power source 30 for piezoelectric element and connected to the contacts 31 when the carrier 80 is set at the work position, as shown in FIGS. 7 and 8. The above control and the controls of the robot 9, the pre-aligner 10, the valve switches 40, the robot drivers 42', the elevator driver 46, the X-Y stage driver 70, the exhausters 50, the lever driver 20 and the N$_2$ gas source controller 41 are made in accordance with a predetermined program by a controller 71 having a microcomputer.

When the first carrier 80 is set to the work position, the rod 52 is moved back, the valve 6 is closed and the work or lithographic process is conducted (step 109).

Subsequently, the above-mentioned steps are repeated, thereby making it possible to automatically conduct the processes for all wafers in the cassette 11. After the processes for the wafers in the cassette 11 have been completed, it is possible to conduct processes for wafers in the cassette 12. Steps to be carried out for the wafers in the cassette 12 are the same as the above-mentioned steps.

As shown in FIG. 11, a T-shaped engaging portion 47 having a form fitting a recessed engaging portion 66, formed in the supporting base 15 of the carrier 80, is fixed to an end portion of the rod 42 and a gear 48 is slidably attached to the rod 42. The gear 48 is gear-coupled to a rack 49 and rotates when the rack 49 is moves in a longitudinal direction thereof by a hydraulic rod driver 42'-3. The rod 42 rotates with the rotation of the gear 48. First, the angular position of the rod 42 is adjusted by the rod driver 42'-3 so that the t-shaped engaging portion 47 takes a vertical direction. Thereafter, the rod 42 is advanced by the rod driver 42'-3 until the T-shaped engaging portion 47 is inserted into the recessed engaging portion 66 of the supporting base 15. When the T-shaped engaging portion 47 is inserted in the recessed engaging portion 66, the gear 48 is rotated by driving the rack 49 by the rod driver 42'-3 to rotate the T-shaped engaging portion 47 by 90° so that the T-shaped engaging portion 47 is completely engaged with the recessed engaging portion 66. By moving the rod 42 forward or backward in this state, it is possible to transport the carrier 80 between the high vacuum chamber 4 and the low vacuum chamber 5. The similar holds for the rod 52.

According to the foregoing embodiment, since the wafer is held at a fixed position by the fixed pins and the movable pin but no electrostatic attraction is applied during transportation of the wafer, the wafer transporting mechanism can be simplified. Also, since the electrostatic attraction as well as the fixing of the wafer by the pins are effected during the processing work for the wafer, the degree of flatness of the wafer can be forcibly improved. Further, the electrical conduction of the wafer is attained with the needle as a contact member sticking in the bottom surface of the wafer during the electrostatic attraction but without changing the degree of flatness of the wafer and undesired substances are prevented from depositing on the wafer surface. Furthermore, the new wafer is placed above the processed wafer in the station of the high vacuum chamber, the deposition of undesired substances on the new wafer is more effectively prevented.

We claim:

1. An apparatus for transporting a wafer, the apparatus comprising:

at least one carrier for supporting a substantially circular thin wafer having a flat plane, said carrier including a supporting base for supporting said wafer thereon, electrostatic attracting means provided in said supporting base and including a contacting surface which face-wise contacts the flat plane of said wafer supported on said supporting base, said electrostatic attracting means attracting said wafer so that the flat plane of said wafer contacts said contacting surface of said electrostatic attracting means when said electrostatic attracting means is energized, and holding means for holding said wafer at a predetermined positional relationship with respect to said supporting base;

means for selectively transporting said carrier between a plurality of stations including a work station;

fixing means for fixing the carrier transported to said work station at a work position which has a predetermined positional relationship with respect to said work station; and means for energizing said electrostatic attracting means when said carrier is fixed at said work position and deenergizing said electrostatic attracting means when said carrier is spaced from said work position.

2. An apparatus according to claim 1, further comprising means for connecting said wafer to a predetermined potential at said work position.

3. An apparatus according to claim 1, wherein said holding means includes a plurality of contact members which contact an outer periphery of said wafer placed at said work position.

4. An apparatus according to claim 3, wherein at least one of said plurality of contact members is movable between a first position where the contact member contacts an outer periphery of said wafer held at the position having the predetermined positional relationship with respect to said supporting base and a second position which is spaced from the outer periphery of said wafer, and the remaining contact members are fixed to said supporting base.

5. An apparatus according to claim 4, further comprising means for selectively moving said at least one contact member between said first position and said second position.

6. An apparatus according to claim 4, wherein each of said plurality of contact members has a pin-like shape.

7. An apparatus for transporting a wafer, the apparatus comprising:

at least one carrier including a supporting base for supporting substantially circular thin wafer having a flat plane, electrostatic attracting means provided in said supporting base and having a contacting surface which face-wise contacts the flat plane of said wafer supported on said supporting base, said electrostatic attracting means attracting said wafer so that the flat plane of said wafer contacts said contacting surface of said electrostatic attracting means when said electrostatic attracting means is energized, and means for holding said wafer at a predetermined positional relationship with respect to said supporting base;

a first station provided so that said carrier can be received from an exterior and held and the held carrier can be removed to an exterior of said first station;

a second station for receiving said carrier from the exterior and holding the received carrier, said carrier being held at a work position having a predetermined positional relationship with respect to said second station;

a third station including first and second receiving portions adapted to receive and hold said wafer, said third station being selectively communicatable with said first and second stations, said third station being selectively movable to a first position enabling the transport of said carrier between said first station and said first receiving portion and a second position enabling the transport of said carrier between said first station and said second receiving portion when said third station communicates with said first station and to a third position enabling the transport of said carrier between said second station and said first receiving portion and a fourth position enabling the transport of said carrier between said second station and said second receiving portion when said third station communicates with said second station;

means for transporting said carrier between said first station and any one of said first and second receiving portions when said third station is in either said first or second position;

means for transporting said carrier between said second station and any one of said first and second receiving portions when said third station is in either said third or fourth position; and means for energizing said electrostatic attracting means when said carrier is held at said work position of said second station and deenergizing said electrostatic attracting means when said carrier is spaced from said work position.

8. An apparatus according to claim 7, further comprising means for connecting said wafer held on said supporting base of said carrier to a predetermined potential when said carrier is held at said work position of said second station.

9. An apparatus according to claim 8, wherein said means for connecting said wafer to the predetermined potential includes a movable member having a conductive terminal and attached to said supporting base so that said movable member is movable between a first position where said conductive terminal electrically contacts the flat plane of said wafer and a second position where said conductive terminal is isolated from the flat plane of said wafer, and a piezoelectric element for moving said movable member to one of said first and second positions when said piezoelectric element is energized and to the other of said first and second positions when said piezoelectric element is deenergized.

* * * * *